(12) United States Patent
Tanzawa (10) Patent No.: US 11,978,529 B2
(45) Date of Patent: May 7, 2024

(54) RANDOM ACCESS-TYPE MEMORY CIRCUIT AND MEMORY SYSTEM

(71) Applicant: NATIONAL UNIVERSITY CORPORATION SHIZUOKA UNIVERSITY, Shizuoka (JP)

(72) Inventor: Toru Tanzawa, Hamamatsu (JP)

(73) Assignee: National University Corporation Shizuoka University (JP)

( * ) Notice: Subject to any disclaimer, the term of this patent is extended or adjusted under 35 U.S.C. 154(b) by 127 days.

(21) Appl. No.: 17/801,864

(22) PCT Filed: Feb. 18, 2021

(86) PCT No.: PCT/JP2021/006183
§ 371 (c)(1),
(2) Date: Aug. 24, 2022

(87) PCT Pub. No.: WO2021/172170
PCT Pub. Date: Sep. 2, 2021

(65) Prior Publication Data
US 2023/0170005 A1    Jun. 1, 2023

(30) Foreign Application Priority Data
Feb. 28, 2020 (JP) .................... 2020-033160

(51) Int. Cl.
*G11C 7/22* (2006.01)
*G11C 7/02* (2006.01)
*G11C 7/24* (2006.01)

(52) U.S. Cl.
CPC ............. *G11C 7/222* (2013.01); *G11C 7/02* (2013.01); *G11C 7/24* (2013.01)

(58) Field of Classification Search
CPC .. G11C 7/222; G11C 7/02; G11C 7/24; G11C 5/063; G11C 11/56; G11C 8/08; G11C 13/00
See application file for complete search history.

(56) References Cited

U.S. PATENT DOCUMENTS

2014/0104922 A1    4/2014 Tiburzi et al. ................ 365/148
2016/0035423 A1    2/2016 Nam et al.

FOREIGN PATENT DOCUMENTS

JP    2007-026627 A    2/2007

OTHER PUBLICATIONS

International Search Report dated Apr. 20, 2021 in corresponding PCT International Application No. PCT/JP2021/006183.
(Continued)

*Primary Examiner* — Joshua L Schwartz
(74) *Attorney, Agent, or Firm* — OSTROLENK FABER LLP (57) ABSTRACT

A memory circuit includes: a memory array unit including a plurality of memory cells-MG and a word line for connecting the plurality of memory cells-MG to each other and applying a drive voltage for driving the memory cells; a drive voltage control unit that generates a drive voltage in which a pre-pulse is set at a timing corresponding to the rising or falling of a voltage signal that changes by a predetermined voltage value in a stepwise manner, applies the drive voltage to a terminal of the word line, and performs control to variably set the time width or the peak value of the pre-pulse in the drive voltage based on address information designating the memory cell at an access destination received from the outside; and a sense amplifier unit that accesses the memory cell-MG designated by the address information.

9 Claims, 8 Drawing Sheets (56) References Cited

OTHER PUBLICATIONS

Kazuki Matsuyama and Toru Tanzawa, "A Pre-Emphasis Pulse Generator Insensitive to Process Variation for Driving Large Memory and Panel Display Arrays with Minimal Delay Time", IEEE Asia Pacific Conference on Circuits and Systems (APCCAS), Nov. 2019, pp. 45-48.

International Preliminary Report on Patentability (Form PCT/IB/338) dated Sep. 9, 2022 in corresponding PCT International Application No. PCT/JP2021/006183.

RANDOM ACCESS-TYPE MEMORY CIRCUIT AND MEMORY SYSTEM

CROSS-REFERENCE TO RELATED APPLICATIONS

The present application is a 35 U.S.C. §§ 371 national stage application of International Application No. PCT/JP2021/006183 filed Feb. 18, 2021, which claims priority to Japanese Patent Application No. 2020-033160, filed Feb. 28, 2020, the contents of which are incorporated herein by reference.

TECHNICAL FIELD

Embodiments relate to a random access type memory circuit and a memory system.

BACKGROUND ART

In semiconductor memories (a flash memory, a 3D cross-point memory, and the like) that have become widespread in recent years, a linear wiring portion is provided as a word line for driving memory cells arranged in a row. Since such a wiring portion has a parasitic resistance and a parasitic capacitance, a delay time determined by these occurs in a voltage signal propagating through the wiring portion. Therefore, in order to increase the access speed of such a semiconductor memory, how to shorten the signal delay time in the wiring portion becomes a problem. As a technique for shortening the delay time in such a wiring portion, a method called Pre-Emphasis is used in which a front part of the pulse waveform applied to the wiring portion is raised larger than usual. Non Patent Literature 1 describes a technique for optimizing the time width of pre-emphasis in order to shorten the delay time.

CITATION LIST

Non Patent Literature

Non Patent Literature 1: Kazuki Matsuyama and Toni Tanzawa, "A Pre-Emphasis Pulse Generator Insensitive to Process Variation for Driving Large Memory and Panel Display Arrays with Minimal Delay Time", IEEE Asia Pacific Conference on Circuits and Systems (APCCAS), Nov. 2019.

SUMMARY OF INVENTION

Technical Problem

In the conventional technique described above, in the case of a random access type memory for accessing a memory cell at an address designated by a command from the outside, there has been a tendency that the access speed is not sufficiently fast. That is, since a voltage signal having the same waveform is applied to a wiring portion to which a plurality of memory cells are connected, there is room for improvement in the waveform control of the voltage signal in the random access type memory.

The present embodiment has been made in view of the aforementioned problems, and it is an object of the present embodiment to provide a random access type memory capable of realizing a high access speed and a memory system including the random access type memory.

Solution to Problem

In order to solve the above problems, a random access type memory circuit according to a form of the present disclosure includes: a memory array unit including a plurality of memory cells and a wiring portion for connecting the plurality of memory cells to each other and applying a drive voltage for driving the memory cells; a voltage application unit configured to generate a drive voltage, in which a pre-pulse is set at a timing corresponding to rising or falling of a voltage signal that changes by a predetermined voltage value in a stepwise manner, and apply the drive voltage to a terminal of the wiring portion; a control unit configured to control the voltage application unit to variably set a time width or a peak value of the pre-pulse in the drive voltage based on address information designating a memory cell at an access destination received from an outside; and an access unit configured to access the memory cell designated by the address information.

According to the random access type memory circuit of the above form, the drive voltage in which a pre-pulse is set at the timing of the rising or falling of the stepped voltage signal is generated by the voltage application unit, and the drive voltage is applied to the terminal of the wiring portion. At this time, the time width or the peak value of the pre-pulse is changed based on the address information received from the outside by the control unit, and the memory cell designated by the address information is accessed by the access unit. Therefore, since the memory cell can be driven by using the drive voltage having a pre-pulse with a time width or a peak value corresponding to the address of the memory cell to be accessed, it is possible to shorten the delay time of the rising of the drive voltage transmitted to the memory cell. As a result, the drive time of the memory cell to be accessed in the random access type memory circuit can be shortened each time, and it is possible to realize a high access speed.

Advantageous Effects of Invention

According to the embodiment, it is possible to realize a high access speed in the random access type memory circuit.

DESCRIPTION OF EMBODIMENTS

Hereinafter, preferred embodiments of a random access type memory circuit according to the present invention will be described in detail with reference to the diagrams. In addition, in the description of the diagrams, the same or equivalent portions are denoted by the same reference numerals, and repeated descriptions thereof will be omitted.

Figure 1:
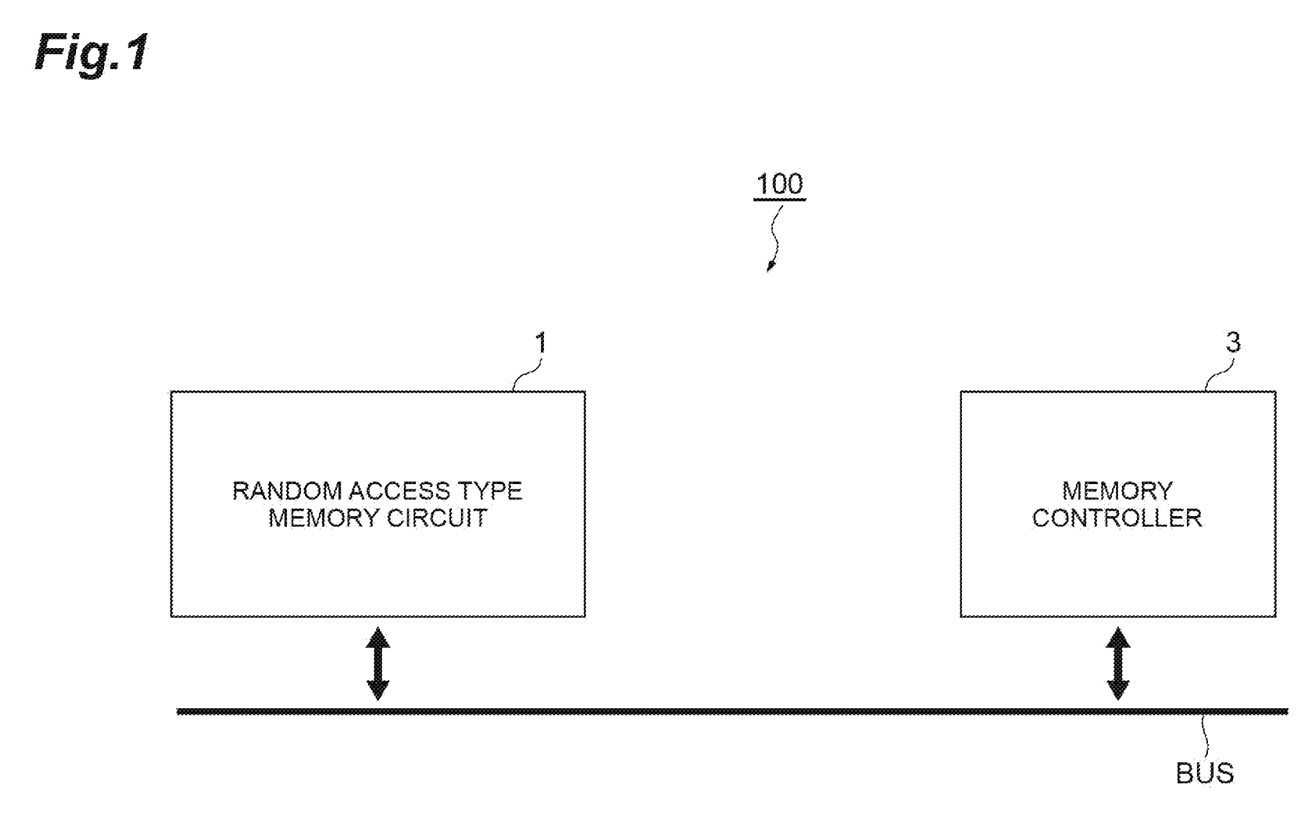
FIG. 1 is a diagram showing the schematic configuration of a memory device including a random access type memory circuit according to a preferred embodiment of the present invention.

As shown in FIG. 1, a memory circuit 1, which is a random access type memory circuit that is a preferred embodiment of the present invention, can be used as a memory device (memory system) 100 in combination with a memory controller 3. The memory controller 3 is an IC that is connected to the memory circuit 1 so as to be able to transmit and receive electrical signals through a system bus BUS and that controls the operation of the memory circuit 1, and writes data to the memory circuit 1 or reads data from the memory circuit 1 through the system bus BUS, that is, accesses the memory circuit 1 through the system bus BUS. Specifically, in response to a request from the outside, the memory controller 3 transmits address information for designating the address (memory cell) of an access destination in the memory circuit 1 and a command for making a request for access by designating the type of access, to the memory circuit 1, through the system bus BUS. Examples of the type designated by the command include reading data from the memory cell in the memory circuit 1 and writing data to the memory cell in the memory circuit 1. According to the command, the memory controller 3 transmits and receives the data written to the designated address in the memory circuit 1 or the data read from the address to and from the memory circuit 1.

Figure 2:
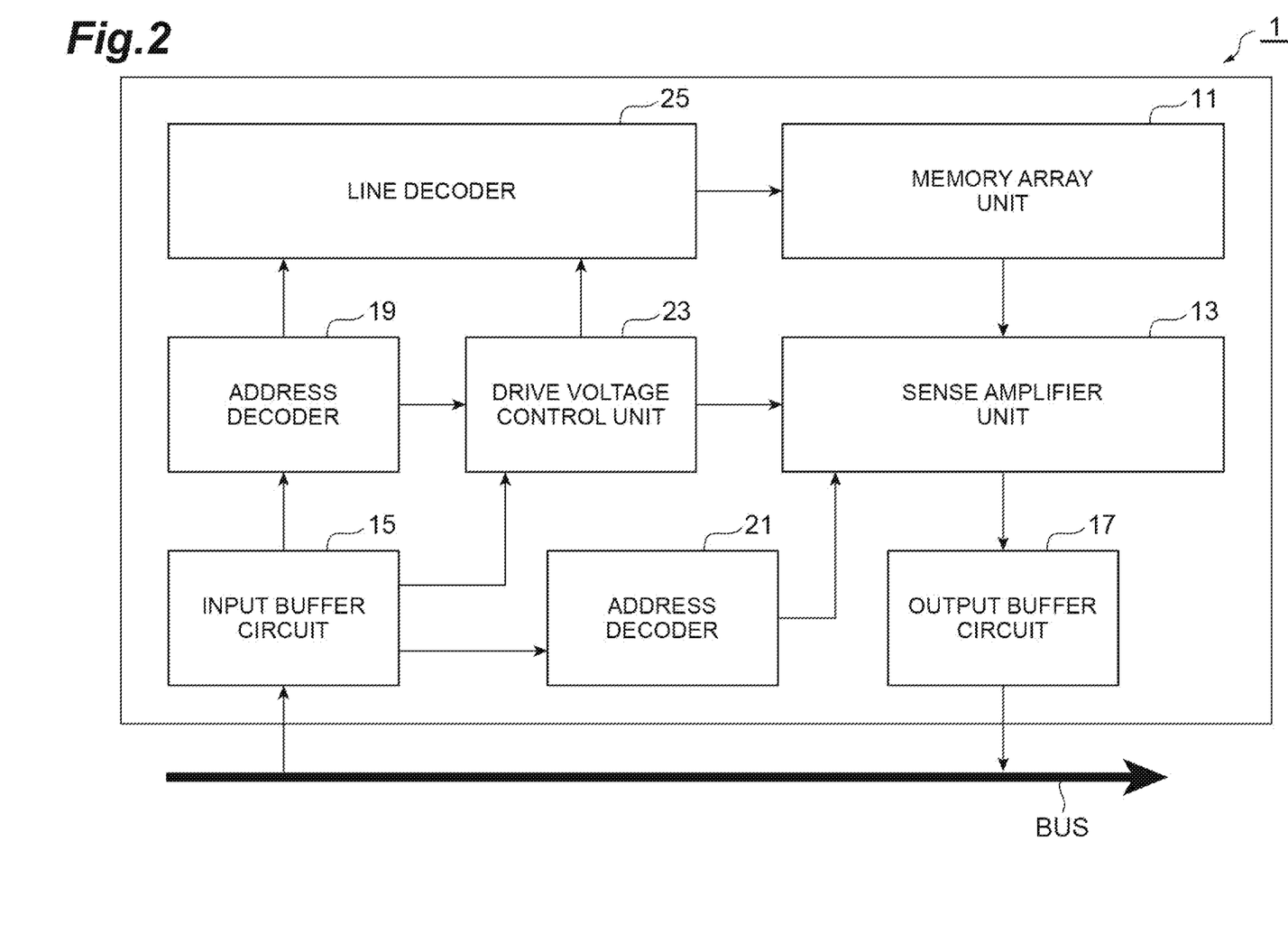
FIG. 2 is a block diagram showing the overall configuration of a memory circuit 1 in FIG. 1.

FIG. 2 is a block diagram showing the overall configuration of the memory circuit 1. The memory circuit 1 is a semiconductor memory in which a plurality of transistors (MOSFETs) are mounted on a semiconductor chip. As shown in FIG. 2, the memory circuit 1 is configured to include a memory array unit 11, a sense amplifier unit (access unit) 13, an input buffer circuit 15, an output buffer circuit 17, address decoders 19 and 21, a drive voltage control unit (voltage application unit, control unit) 23, and a line decoder 25. The memory array unit 11, the sense amplifier unit 13, the input buffer circuit 15, the output buffer circuit 17, the address decoders 19 and 21, the drive voltage control unit 23, and the line decoder 25 are formed on the same semiconductor chip.

The memory array unit 11 is configured by arranging a plurality of memory cells, which are transistors (MOSFETs), in a two-dimensional array, and has a function of storing binary or multi-value data in each of the memory cells. The memory array unit 11 includes a plurality of sub-array units in which a plurality of (for example, 1024) memory cells are arranged one-dimensionally (linearly).

The input buffer circuit 15 receives address information and a command from the memory controller 3 through the system bus BUS. The address decoder 19 converts the address information into a row address for designating a sub-array unit in the memory array unit 11 at the access destination (hereinafter, referred to as a row address). The address decoder 21 converts the address information into a column address for designating a memory cell in the sub-array unit at the access destination (hereinafter, referred to as a column address).

The sense amplifier unit 13 measures the current or voltage of the bit line electrically connected to each memory cell in the sub-array unit of the memory array unit 11, and detects the value of data stored in each memory cell according to the current or voltage (performs data sensing). That is, the sense amplifier unit 13 performs data sensing on the memory cell corresponding to the column address output from the address decoder 21, and outputs data detected as a result to the output buffer circuit 17.

The drive voltage control unit 23 controls an operation of writing data or reading data in a memory cell at a predetermined address in the memory circuit 1 according to the address information and the command received from the memory controller 3 through the input buffer circuit 15. For example, when writing data, the drive voltage control unit 23 controls the input buffer circuit 15 and a circuit unit for data writing (not shown) to store the data in the memory cell at a predetermined address. In addition, when reading data, the drive voltage control unit 23 controls the line decoder 25 and the sense amplifier unit 13 to read the data from the memory cell at a predetermined address. The drive voltage control unit 23 includes a control circuit such as a small processor and a voltage signal generation circuit including an amplifier, a transistor, and the like.

Specifically, when the drive voltage control unit 23 is requested to read data by a command, the drive voltage control unit 23 generates a drive voltage, in which the time width or the peak value of a pre-pulse is set corresponding to the column address designated by the address information, based on the address information (details will be described later). In addition, the drive voltage control unit 23 controls a timing at which the sense amplifier unit 13 starts data sensing and a timing at which data is output from the sense amplifier unit 13.

The line decoder 25 selects a sub-array unit corresponding to the row address input from the address decoder 19, and applies a drive voltage generated by the drive voltage control unit 23 to the selected sub-array unit. The output buffer circuit 17 outputs the value of data detected for the memory cell corresponding to the column address by the sense amplifier unit 13 to the memory controller 3 through the system bus BUS.

Figure 3:
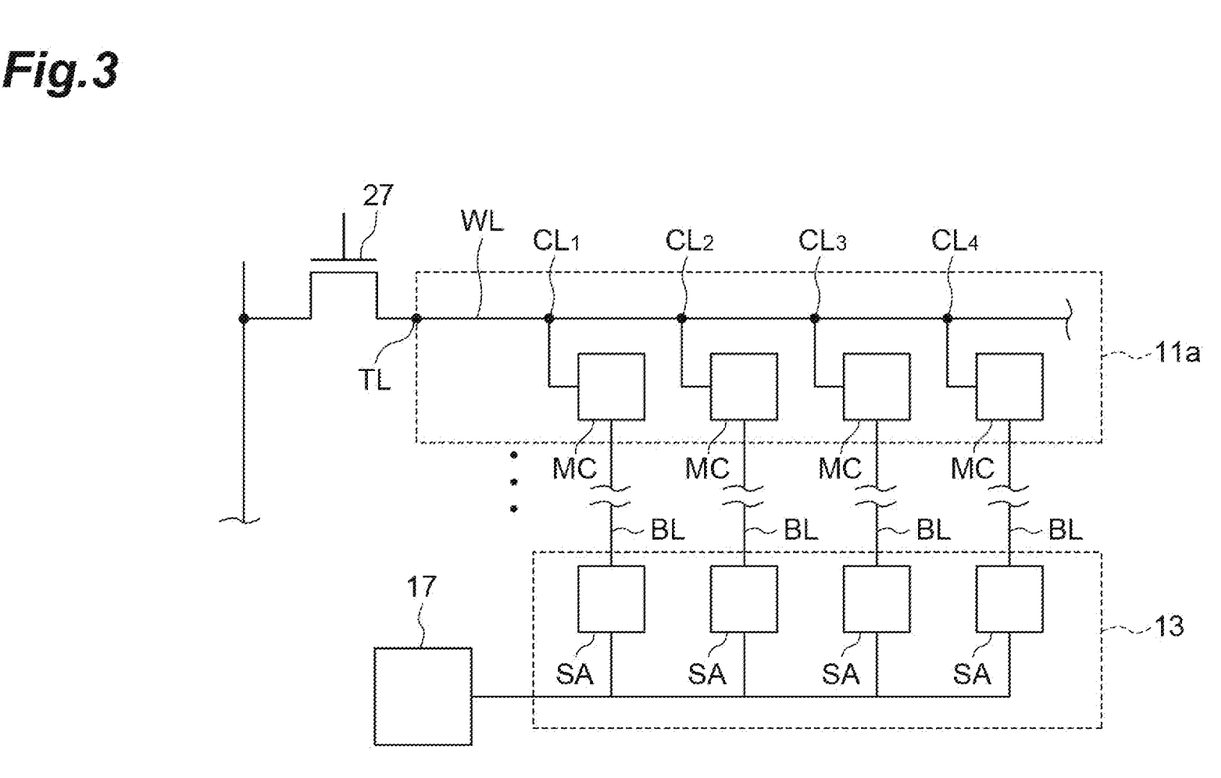
FIG. 3 is a diagram showing a circuit configuration around a memory array unit 11 of the memory circuit 1.

FIG. 3 shows a circuit configuration around the memory array unit 11 of the memory circuit 1. Each sub-array unit 11a in the memory array unit 11 has a plurality of (for example, 1024) memory cells MC linearly arranged and a word line WL, which is a linear wiring portion that is electrically connected to the memory cells MC to apply a drive voltage for driving the memory cells MC. For example, when the memory cell MC is a FET, the word line WL is electrically connected to the gate of the memory cell MC. However, in the present embodiment, the plurality of memory cells MC are not limited to being linearly arranged, and may be arranged along a curve or along a polygonal line. In such a case, the word line WL is formed as a curved line or a polygonal line to connect the plurality of memory cells MC to each other.

Specifically, the word line WL has a terminal TL for applying a drive voltage from the line decoder 25, and the gates of the plurality of memory cells MC are electrically connected to the word line WL at connection points $CL_1$, $CL_2$, $CL_3$, $CL_4$, ... provided at intervals of a predetermined distance from the terminal TL side along the word line WL, respectively. When the row address of the sub-array unit 11a is designated by the address information, a switch 27 included in the line decoder 25 is turned on and accordingly, the drive voltage is selectively applied from the drive voltage control unit 23 to the terminal TL of the word line WL.

In addition, a plurality of (for example, 1024) sense amplifiers SA provided in the sense amplifier unit 13 corresponding to the respective memory cells MC are electrically connected to the respective memory cells MC in the sub-array unit 11a through a bit line BL that is a wiring portion. For example, when the memory cell MC is a FET, the sense amplifier SA is electrically connected to the drain of the memory cell MC. Each sense amplifier SA in the sense amplifier unit 13 is commonly provided in each corresponding memory cell MC in the plurality of sub-array units 11a. When reading data from each memory cell MC, the sense amplifier SA detects the drain current (or the drain voltage) of each memory cell MC according to the drive voltage, which is a stepped voltage signal applied to the word line WL, and determines the value of data stored in each memory cell MC by comparing the drain current (or the drain voltage) with a threshold value. At this time, the sense amplifier SA corresponding to the column address output from the address decoder 21 is selected, and the value of the data determined by the selected sense amplifier SA is output to the output buffer circuit 17.

Next, the details of the drive voltage generated by the drive voltage control unit 23 described above will be described.

Figure 4:
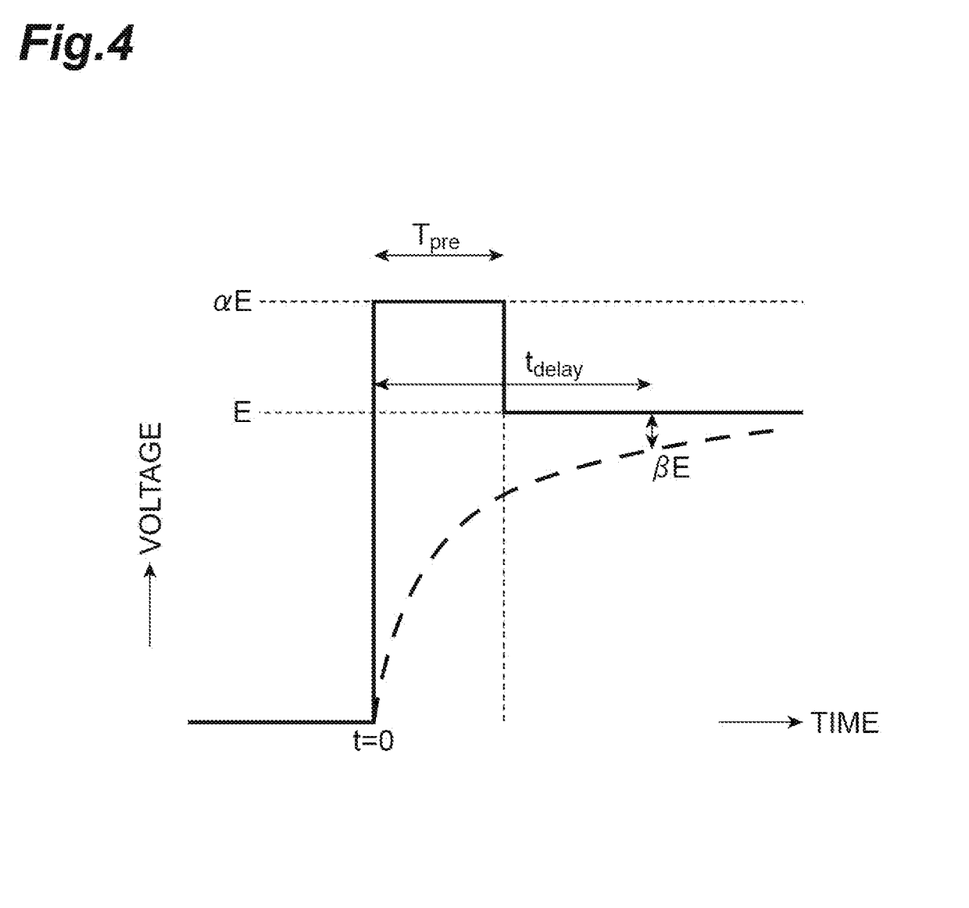
FIG. 4 is a diagram showing the waveform of a drive voltage generated by a drive voltage control unit 23.

FIG. 4 shows the waveform of a drive voltage generated by the drive voltage control unit 23. Assuming that the time at the start of an operation of accessing the memory cell MC of each sub-array unit 11a is t=0, the drive voltage control unit 23 generates a drive voltage in which a pre-pulse having a peak value ($\alpha \times E$, $\alpha$ is a real number set in advance) is set at the timing of time t=0 corresponding to the rising of the voltage signal that changes (rises) by a predetermined voltage value E in a stepwise manner. At this time, the drive voltage control unit 23 sets a period (time width) $T_{pre}$, in which the pre-pulse from time t=0 is set, variably according to the connection points $CL_1$, $CL_2$, $CL_3$, $CL_4$, . . . between the word line WL and the memory cells MC at the access destinations. In other words, the drive voltage control unit 23 sets the drive voltage so that, in the stepped voltage signal with the predetermined voltage value E that rises after time t=0, a pre-emphasis voltage with a voltage value of $\alpha \times E$ is generated in the variable period $T_{pre}$ at the front part corresponding to the rising of the stepped voltage signal.

Specifically, the drive voltage control unit 23 specifies a range of the magnitude of the distance between the terminal TL and each of the connection points $CL_1$, $CL_2$, $CL_3$, $CL_4$, . . . of the memory cell MC based on the row address of the memory cell MC at the access destination designated by the address information, and increases or decreases the pre-pulse period $T_{pre}$ according to the range. The distance referred to herein is a distance along the path along which the word line WL extends. As an example, the drive voltage control unit 23 specifies the range of the distance between the connection point of the memory cell MC and the terminal TL by dividing the range into "range 1", which is a range from the connection point $CL_1$ closest to the terminal TL on the word line WL to the midpoint, and "range 2", which is a range from the midpoint to the connection point farthest from the terminal TL, and sets the period $T_{pre}$ to a relatively short period $T_s$ when the specified range is "range 1" and sets the period $T_{pre}$ to a relatively long period $T_L$ when the specified range is "range 2". However, the range of the distance between the terminal TL and the connection point of the memory cell MC designated by the drive voltage control unit 23 is not limited to two ranges, and may be three or more ranges. In this case, according to the number of ranges specified, the drive voltage control unit 23 increases or decreases the period $T_{pre}$ in a stepwise manner by the value corresponding to the number.

Figure 5:
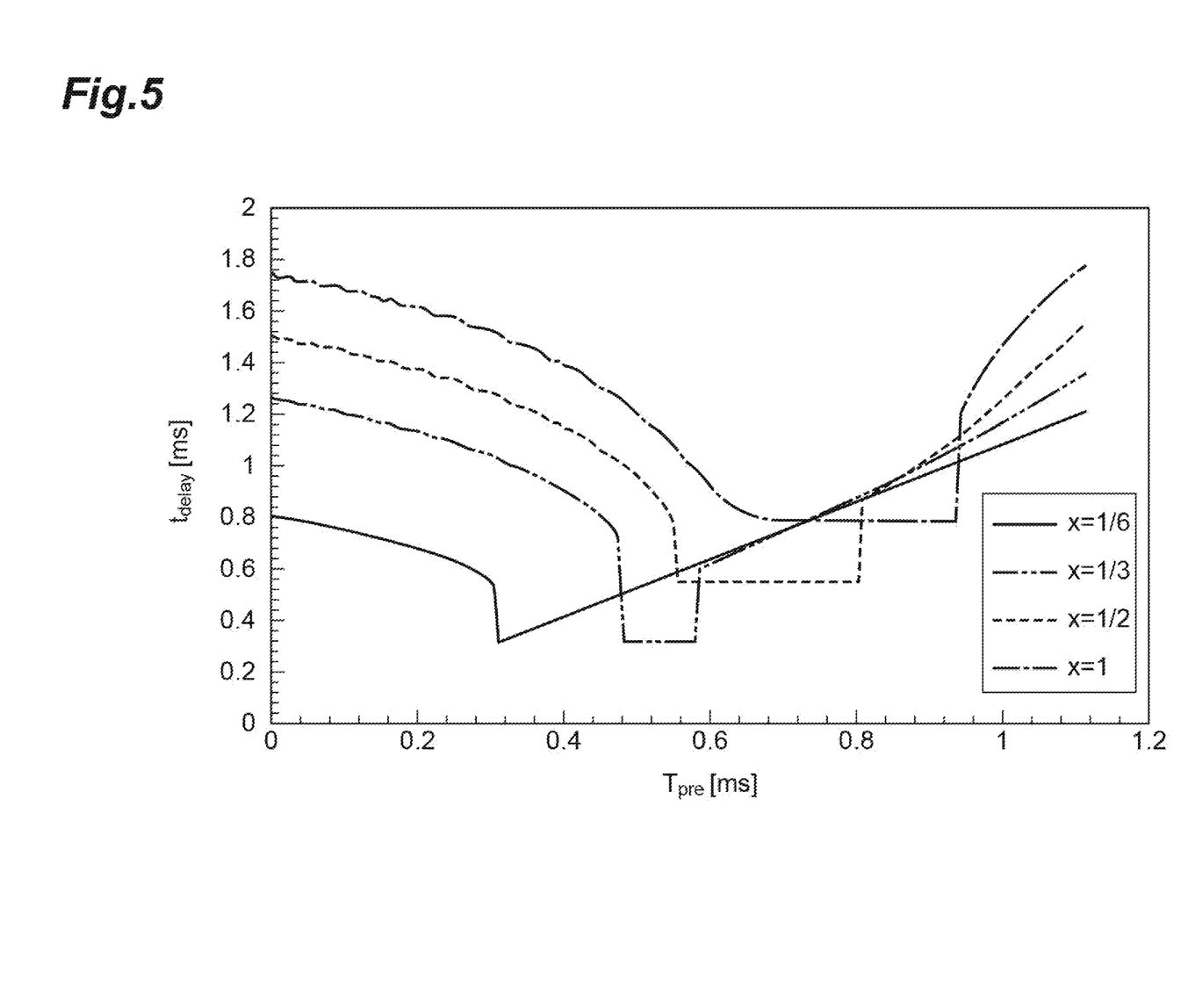
FIG. 5 is a graph showing the result of theoretical calculation of delay time $t_{delay}$ of a drive voltage at each connection point on a word line WL when a pre-pulse period $T_{pre}$ is changed.

The word line WL through which the drive voltage generated by the drive voltage control unit 23 propagates can be considered to be equivalent to a transmission line in which an impedance component (parasitic resistance component) and a capacitance component (parasitic capacitance component) excluding a conductance component and a reactance component are distributed. Specifically, the word line WL can be considered to be a transmission line having a length of 1 [m] from the terminal TL to the connection point at the farthest end, a resistance of R [Ω/m] per unit length, and a capacitance of C [F/m] per unit length, and the total resistance can be estimated as R×1 [Ω] and the total capacitance can be estimated as C×1 [F]. FIG. 5 shows a graph of the result of theoretical calculation of the delay time of the drive voltage at each connection point on the word line WL when the pre-pulse period $T_{pre}$ is changed. Here, the position x of the terminal TL to which the drive voltage is applied is set to x=0, and the position x of the connection point at the farthest end of the word line WL is set to x=1. In addition, the theoretical time for the voltage at an arbitrary position x on the word line WL to reach the voltage value $(1-\beta) \times E$ (where $\beta=0.1$) can be considered to be the delay time $t_{delay}$.

As described above, it can be seen that the pre-pulse period $T_{pre}$ for reducing the delay time $t_{delay}$ changes depending on the position of the connection point on the word line WL. For example, at the position x=1 of the connection point at the farthest end, it can be seen that the delay time $t_{delay}$ can be made to converge to the minimum value of 0.9 ms by setting the period $T_{pre}=0.74$ ms. At the positions of the other connection points, it can also be seen that the delay time $t_{delay}$ can be made to converge to the minimum value by setting the shorter period $T_{pre}$. By using the above characteristics, the drive voltage control unit 23 sets the pre-pulse period $T_{pre}$ so as to minimize the delay time $t_{delay}$ at the connection point of the memory cell MC to be accessed. At this time, the drive voltage control unit 23 sets the pre-pulse period $T_{pre}$ at each connection point with a value proportional to the magnitude of the resistance R and the capacitance C of the word line WL.

The drive voltage control unit 23 controls the timing at which the sense amplifier unit 13 starts data sensing and the timing at which data is output from the sense amplifier unit 13 according to the drive voltage control described above.

That is, the drive voltage control unit 23 increases or decreases a waiting time (hereinafter, referred to as latency) from the start timing of the access operation to the start of data sensing and data output according to the row address of the memory cell MC at the access destination. More specifically, the drive voltage control unit 23 sets the latency variably according to the range of the magnitude of the distance between the terminal TL and the connection position of the memory cell MC on the word line WL determined by the row address. The waiting time is set stepwise so as to correspond to the delay time $t_{delay}$ estimated for the connection position on the word line WL and the set pre-pulse period $T_{pre}$. At this time, the drive voltage control unit 23 sets the latency corresponding to the memory cell MC at the access destination with a value proportional to the magnitude of the resistance R and the capacitance C of the word line WL.

Figure 6:
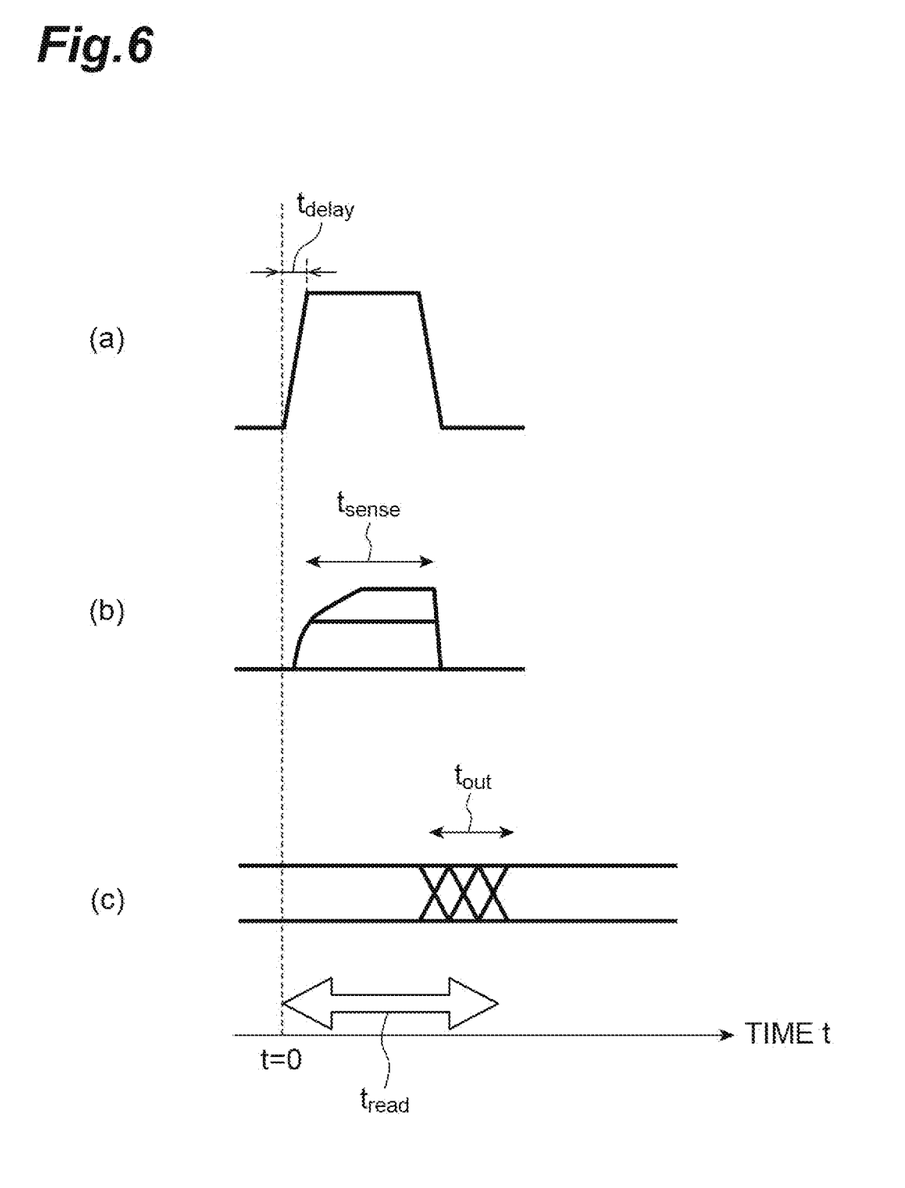
FIG. 6 is a timing chart showing an example of a signal waveform in each unit of the memory circuit 1 when a memory cell MC at the access destination is "range 1" on the near end side.
Figure 7:
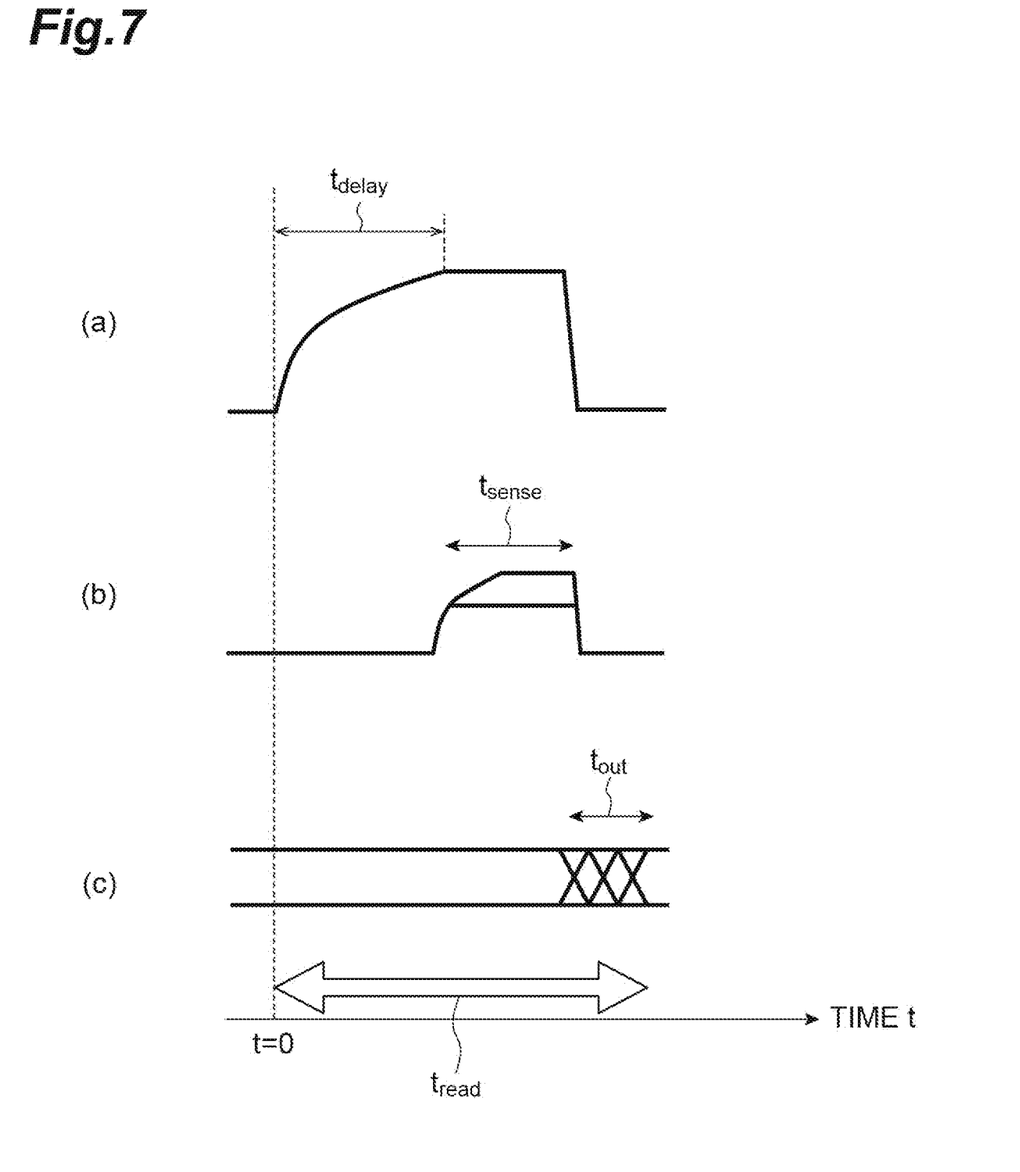
FIG. 7 is a timing chart showing an example of a signal waveform in each unit of the memory circuit 1 when the memory cell MC at the access destination is "range 2" on the far end side.

FIG. 6 shows an example of a signal waveform in each unit of the memory circuit 1 when the memory cell MC at the access destination is "range 1" on the near end side. The part (a) of FIG. 6 shows the waveform of a drive voltage applied to the memory cell MC, the part (b) of FIG. 6 shows the waveform of a data signal output from the sense amplifier SA, and the part (c) of FIG. 6 shows the waveform of a data signal output from the output buffer circuit 17. In addition, FIG. 7 shows an example of a signal waveform in each unit of the memory circuit 1 when the memory cell MC at the access destination is "range 2" on the far end side. The part (a) of FIG. 7 shows the waveform of a drive voltage applied to the memory cell MC, the part (b) of FIG. 7 shows the waveform of a data signal output from the sense amplifier SA, and the part (c) of FIG. 7 shows the waveform of a data signal output from the output buffer circuit 17.

As shown in FIGS. 6 and 7, the waveform of the drive voltage is controlled so that the delay time of the applied drive voltage is $t_{delay}$ minimized according to the position of the memory cell MC at the access destination on the word line WL, the latency up to a data sensing period $T_{sense}$ of the sense amplifier SA is set corresponding to the delay time $t_{delay}$, and the latency up to a data output period t out of the output buffer circuit 17 is controlled corresponding to the delay time $t_{delay}$ and the data sensing period $T_{sense}$. As a result, a read access time $t_{read}$ from the start of the access operation to the data output can be shortened by about 20% on average as compared with a case where the waveform control of the drive voltage is not performed.

In addition, returning to FIG. 1, the memory controller 3 has a function of controlling the waiting time from the transmission of the command to the reading of the data output from the memory circuit 1 according to the read access time $t_{read}$ the memory circuit 1. Specifically, the memory controller 3 increases or decreases the waiting time from the transmission of the command to the reading of the data output on the system bus BUS according to the row address of the memory cell MC designated by the address information. The waiting time is set in advance corresponding to the read access time $t_{read}$ of the designated memory cell MC. As a result, the access time when accessing the memory circuit 1 from the memory controller 3 can be minimized.

The function and effect of the memory device 100 according to the embodiment described above will be described.

In the memory circuit 1 described above, a drive voltage in which a pre-pulse is set at the rising timing of a stepped voltage signal is generated by the drive voltage control unit 23, and the drive voltage is applied to the terminal TL of the word line WL by the line decoder 25. At this time, the time width of the pre-pulse is changed based on the address information received from the outside by the drive voltage control unit 23, and the memory cell MC designated by the address information is accessed by the sense amplifier unit 13. Therefore, since the memory cell MC can be driven by using the drive voltage having a pre-pulse with a time width corresponding to the row address of the memory cell MC to be accessed, it is possible to shorten the delay time $t_{delay}$ of the rising of the drive voltage transmitted to the memory cell MC. As a result, the drive time of the memory cell MC to be accessed in the random access type memory circuit 1 can be shortened each time, and it is possible to realize a high access speed.

Here, the drive voltage control unit 23 performs control to increase or decrease the time width of the pre-pulse according to the magnitude of the distance between the terminal TL and the connection position between the word line WL and the memory cell MC designated by the address information. In this case, since the time width of the pre-pulse is increased or decreased according to the distance between the connection position of the memory cell MC in the word line WL and the terminal TL to which the drive voltage is applied, it is possible to easily shorten the delay time $t_{delay}$ of the rising of the drive voltage transmitted to the memory cell MC. As a result, it is possible to easily realize a high access speed.

In addition, the sense amplifier unit 13 increases or decreases the waiting time from the access request to the access to data according to the magnitude of the distance between the terminal TL and the connection position between the word line WL and the memory cell MC designated by the address information. In this manner, since the waiting time until data access to the memory cell MC is increased or decreased according to the distance between the connection position of the memory cell MC in the word line WL and the terminal TL to which the drive voltage is applied, the speed of access to the memory cell MC can be optimized to the speed corresponding to the delay time $t_{delay}$ of the rising of the drive voltage. As a result, it is possible to reliably realize a high access speed.

In addition, the drive voltage control unit 23 performs control to set the time width of the pre-pulse corresponding to the magnitude of the parasitic resistance and the parasitic capacitance in the word line WL. In this case, it is possible to shorten the delay time $t_{delay}$ of the rising of the drive voltage transmitted to the memory cell MC corresponding to the electrical characteristics of the word line WL. As a result, it is possible to increase the access speed corresponding to the memory circuit 1 having different electrical characteristics.

In addition, the sense amplifier unit 13 sets the waiting time for data access to a time corresponding to the magnitude of the parasitic resistance and the parasitic capacitance in the word line WL. In this case, the speed of data access to the memory cell MC can be optimized to the speed corresponding to the electrical characteristics of the word line WL. As a result, it is possible to increase the access speed corresponding to the memory circuit 1 having different electrical characteristics.

Alternatively, the memory device 100 has a configuration including the memory circuit 1 and the memory controller 3, so that the speed of access to the memory cell MC in the memory circuit 1 is increased. In the memory device 100, the memory controller 3 increases or decreases the latency from the transmission of the command to the reading of the data according to the position of the memory cell MC designated by the address information. According to such a configuration, the speed of the reading of data from the memory circuit 1 in the memory controller 3 is increased.

The present invention is not limited to the embodiment described above. The configuration of the embodiment described above can be changed in various ways.

The above-described embodiment is not limited to storing binary (1-bit) data in the memory cell MC, and may operate so as to store multi-value (2-bit or more) data.

In addition, the above-described embodiment and modification example are not limited to using the drive voltage that rises stepwise as a drive voltage, and may be configured to apply a drive voltage that drops stepwise as a drive voltage. In this case, the drive voltage control unit 23 generates a drive voltage in which a pre-pulse is set at a timing corresponding to the falling of the stepped voltage signal.

In addition, in the embodiment described above, the time width of the pre-pulse of the drive voltage is set variably corresponding to the position of the memory cell MC at the access destination. However, the peak value of the pre-pulse may be set variably corresponding to the position. In addition, both the time width of the pre-pulse and the peak value of the pre-pulse may be set variably corresponding to the position of the memory cell MC.

In addition, in the embodiment described above, the waveform of the drive voltage is controlled when reading the data from the memory cell MC. However, the waveform of the drive voltage may also be controlled in the same manner when writing the data to the memory cell MC.

In addition, when the memory controller 3 configuring the memory device 100 according to the embodiment described above controls the writing of data to the memory cell MC, it is preferable that the memory controller 3 operates so as to write important data, which needs to be read out as quickly as possible, to the address corresponding to the connection point with a small distance to the terminal TL on the word line WL.

In addition, the above-described embodiment is not limited to storing binary (1-bit) data in the memory cell MC, and may operate so as to store multi-value (2-bit or more) data. In addition, the above-described embodiment is not limited to using the drive voltage that rises stepwise as a drive voltage, and may be configured to apply a drive voltage that drops stepwise as a drive voltage.

Figure 8:
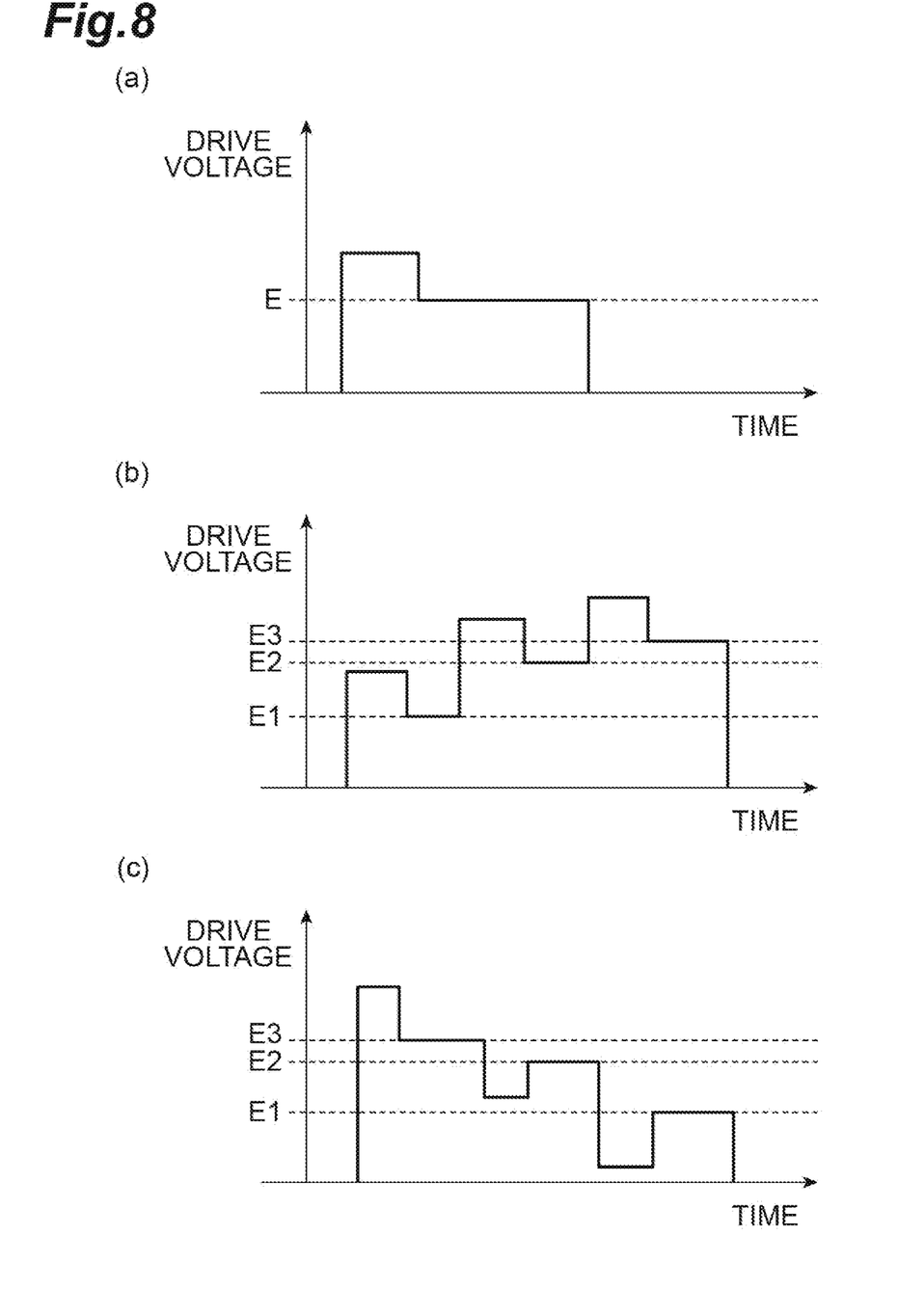
FIG. 8 is a diagram showing the waveforms of drive voltages generated in the embodiment.

The part (a) of FIG. 8 shows the waveform of the drive voltage when 1-bit data is stored, the part (b) of FIG. 8 shows the waveform of the drive voltage when 2-bit data is stored, and the part (c) of FIG. 8 shows the waveform of the drive voltage that drops stepwise. Thus, when reading 1-bit data, a waveform in which a pre-pulse is set is used for the voltage signal that rises to the voltage value E, and when reading 2-bit data, a drive voltage is used which rises sequentially to a plurality of voltage values E1, E2, and E3 (E1<E2<E3) in a stepwise manner in multiple steps and in which a pre-pulse is set at a plurality of timings synchronized with (corresponding to) each rising timing. In addition, when reading 2-bit data, a drive voltage may be used which rises to the voltage value E3 in a stepwise manner first and then gradually drops sequentially to the voltage values E2 and E1 in a stepwise manner in multiple steps (E1<E2<E3). At this time, a pre-pulse having a high peak value is set first in the positive voltage direction with respect to the rising width in synchronization with the timing of rising to the voltage E3 (overdrive), and then a pre-pulse having a high peak value is set in the negative direction with respect to the falling width in synchronization with the respective timings of dropping to the voltages E2 and E1 (underdrive). Even in these cases, the change in the time width of each pre-pulse is controlled based on the address information.

Here, in the embodiment described above, it is also preferable that the control unit performs control to increase or decrease the time width or the peak value of the pre-pulse according to a magnitude of a distance between the terminal and a connection position between the wiring portion and the memory cell designated by the address information. In this case, since the time width or the peak value of the pre-pulse is increased or decreased according to the distance between the connection position of the memory cell in the wiring portion and the terminal to which the drive voltage is applied, it is possible to easily shorten the delay time of the rising of the drive voltage transmitted to the memory cell. As a result, it is possible to easily realize a high access speed. In addition, the "distance" referred to herein means a distance along the path along which the wiring portion extends.

In addition, it is also preferable that the access by the access unit is to read data from the memory cell. In this case, data can be output at high speed from the random access type memory circuit.

In addition, it is also preferable that the access unit increases or decreases a waiting time from an access request to access according to a magnitude of a distance between the terminal and a connection position between the wiring portion and the memory cell designated by the address information. In this manner, since the waiting time until data access to the memory cell is increased or decreased according to the distance between the connection position of the memory cell in the wiring portion and the terminal to which the drive voltage is applied, the speed of access to the memory cell can be optimized to the speed corresponding to the delay time of the rising of the drive voltage. As a result, it is possible to reliably realize a high access speed.

In addition, it is also preferable that the control unit performs control to set the time width or the peak value of the pre-pulse corresponding to a magnitude of a parasitic resistance and a parasitic capacitance in the wiring portion. In this case, it is possible to shorten the delay time of the rising of the drive voltage transmitted to the memory cell corresponding to the electrical characteristics of the wiring portion. As a result, it is possible to increase the access speed corresponding to the memory circuit having different electrical characteristics.

In addition, it is also preferable that the access unit sets the waiting time to a time corresponding to a magnitude of a parasitic resistance and a parasitic capacitance in the wiring portion. In this case, the speed of access to the memory cell can be optimized to the speed corresponding to the electrical characteristics of the wiring portion. As a result, it is possible to increase the access speed corresponding to the memory circuit having different electrical characteristics.

Alternatively, a memory system of another form of the present invention includes: the random access type memory circuit described above; and a control circuit that is connected to the random access type memory circuit through a bus and configured to transmit the address information and a command for an access request to the random access type memory circuit. According to the memory system having such a configuration, in the control circuit, the speed of access to the memory cell in the random access type memory circuit corresponding to the address information and the command is increased.

Here, it is also preferable that the control circuit transmits the command for making a request for reading of data from the memory cell designated by the address information, reads the data output from the random access type memory circuit in response to the transmission of the command, and increases or decreases a waiting time from the transmission of the command to the reading of the data according to a position of the memory cell designated by the address information. With such a configuration, in the control circuit, when reading the data output from the memory cell in the random access type memory circuit to the bus, the waiting time for the reading of the data from the bus is increased or decreased according to the position of the memory cell. Therefore, the speed of the reading of data from the random access type memory circuit in the control circuit is increased.

INDUSTRIAL APPLICABILITY

One aspect of the present disclosure is to realize a high access speed in a random access type memory circuit and a memory system.

REFERENCE SIGNS LIST

1: random access type memory circuit, 3: memory controller (control circuit), 11: memory array unit, 13: sense amplifier unit (access unit), 23: drive voltage control unit (voltage application unit, control unit), 100: memory device (memory system), MC: memory cell, WL: word line (wiring portion), $T_{pre}$: period (time width), TL: terminal, BUS: system bus.

The invention claimed is:

1. A random access type memory circuit, comprising:
   a memory array unit including a plurality of memory cells and a wiring portion for connecting the plurality of memory cells to each other and applying a drive voltage for driving the memory cells;
   a voltage application circuit configured to generate a drive voltage, in which a pre-pulse is set at a timing corresponding to rising or falling of a voltage signal that changes by a predetermined voltage value in a stepwise manner, and apply the drive voltage to a terminal of the wiring portion;
   a controller configures to control the voltage application circuit to variably set a time width or a peak value of the pre-pulse in the drive voltage based on address information designating a memory cell at an access destination received from an outside; and
   an access circuit configured to access the memory cell designated by the address information.

2. The random access type memory circuit according to claim 1,
   wherein the controller performs control to increase or decrease the time width or the peak value of the pre-pulse according to a magnitude of a distance between the terminal and a connection position between the wiring portion and the memory cell designated by the address information.

3. The random access type memory circuit according to claim 1,
   wherein the access by the access circuit is to read data from the memory cell.

4. The random access type memory circuit according to claim 1,
   wherein the access circuit increases or decreases a waiting time from an access request to access according to a magnitude of a distance between the terminal and a connection position between the wiring portion and the memory cell designated by the address information.

5. The random access type memory circuit according to claim 1,
   wherein the controller performs control to set the time width or the peak value of the pre-pulse corresponding to a magnitude of a parasitic resistance and a parasitic capacitance in the wiring portion.

6. The random access type memory circuit according to claim 4,
   wherein the access circuit sets the waiting time to a time corresponding to a magnitude of a parasitic resistance and a parasitic capacitance in the wiring portion.

7. A memory system, comprising: the random access type memory circuit according to claim 1; and
   a control circuit being connected to the random access type memory circuit through a bus and configured to transmit the address information and a command for an access request to the random access type memory circuit.

8. The memory system according to claim 7,
   wherein the control circuit transmits the command for making a request for reading of data from the memory cell designated by the address information, reads the data output from the random access type memory circuit in response to the transmission of the command, and increases or decreases a waiting time from the transmission of the command to the reading of the data according to a position of the memory cell designated by the address information.

9. A random access type memory circuit, comprising:
   a memory array unit including a plurality of memory cells and a wiring portion for connecting the plurality of memory cells to each other and applying a drive voltage for driving the memory cells;
   a voltage application circuit configured to generate a drive voltage, and apply the drive voltage to a terminal of the wiring portion;
   a controller configured to control the voltage application circuit; and
   an access circuit configured to access the memory cell designated by address information designating a memory cell at an access destination received from an outside,
   wherein the access circuit increases or decreases a waiting time from an access request to access according to a magnitude of a distance between the terminal and a connection position between the wiring portion and the memory cell designated by the address information.

* * * * *